United States Patent
Bae et al.

(10) Patent No.: US 8,570,204 B2
(45) Date of Patent: Oct. 29, 2013

(54) FOLDED REFERENCE VOLTAGE FLASH ADC AND METHOD THEREOF

(75) Inventors: Hyun-Min Bae, Seoul (KR); Soon-Won Kwon, Namyangju (KR); Se-Jun Jeon, Seoul (KR)

(73) Assignees: Electronics and Telecommunications Research Institute, Daejeon (KR); Korea Advanced Institute of Science and Technology, Daejeon (KR)

( * ) Notice: Subject to any disclaimer, the term of this patent is extended or adjusted under 35 U.S.C. 154(b) by 0 days.

(21) Appl. No.: 13/527,406

(22) Filed: Jun. 19, 2012

(65) Prior Publication Data

US 2013/0002466 A1    Jan. 3, 2013

(30) Foreign Application Priority Data

Jun. 30, 2011    (KR) .................. 10-2011-0064960

(51) Int. Cl.
   *H03M 1/34*    (2006.01)
(52) U.S. Cl.
   USPC ......................... 341/158; 341/155; 341/156

(58) Field of Classification Search
   USPC ................... 341/155, 156, 158, 126
   See application file for complete search history.

(56) References Cited

U.S. PATENT DOCUMENTS

| | | | |
|---|---|---|---|
| 5,864,310 A * | 1/1999 | Khorramabadi | 341/118 |
| 6,762,707 B2 * | 7/2004 | Wolf et al. | 341/155 |
| 7,075,472 B1 * | 7/2006 | Hsueh | 341/156 |
| 7,187,317 B2 * | 3/2007 | Oka | 341/156 |
| 7,750,831 B2 * | 7/2010 | Bae et al. | 341/126 |
| 2003/0164786 A1 * | 9/2003 | Wolf et al. | 341/155 |

OTHER PUBLICATIONS

Hung-Yu Huang et al., "A 5-bit 1 GSample/s Two-Stage ADC with a New Flash Folded Architecture", 2007, IEEE.

* cited by examiner

*Primary Examiner* — Jean B Jeanglaude

(57) ABSTRACT

A folded reference voltage flash analog-to-digital (ADC) converter and a method thereof are provided. The flash ADC of the present invention determines the most significant bit (MSB) of an analog input signal, varies a reference voltage input to a plurality of comparators in accordance with the MSB determination result, and determines the remaining bits. Accordingly, input capacitance can be reduced while maintaining the size and power consumption of the ADC.

10 Claims, 6 Drawing Sheets

MSB = 1

MSB = 0

FOLDED REFERENCE VOLTAGE FLASH ADC AND METHOD THEREOF

CROSS-REFERENCE TO RELATED APPLICATION

This application claims the benefit under 35 U.S.C. §119(a) of Korean Patent Application No. 10-2011-0064960, filed on Jun. 30, 2011, the entire disclosure of which is incorporated herein by reference for all purposes.

BACKGROUND

1. Field

The following description relates to an analog-to-digital conversion technique, and more particularly, to an analog-to-digital conversion technique using a flash method combined with a folding method.

2. Description of the Related Art

Along with increasing demand for broadband digital communication, optical storage apparatuses, and the like, demand for analog-to-digital converters (hereinafter, referred to as "ADCs") with higher conversion speed and higher resolution is also increasing. The ADC is a device which converts input analog signals into digital signals with one of a voltage form and a current form.

As examples of a high-speed ADC, a flash ADC, a folding and interpolating ADC, a pipeline ADC, and the like may be given.

The flash ADC is a parallel comparison type ADC, and converts analog signals into digital signals. The flash ADC is suitable for applications which require a wide bandwidth and high-speed processing, and does not sequentially calculate only one clock cycle at a time, but simultaneously completes all the analog-to-digital conversion processes.

The flash ADC uses a method of comparing analog input signals with a reference voltage divided by several resistor ladders, using each comparator. In order to obtain an N-bit flash ADC, $2^{N-1}$ number of comparators and $2^N$ number of resistors are required. When a comparison voltage is applied to the resistors in a ladder configuration, the comparators at each level of the resistor ladder generate a logical bit in order of decreasing significance as the ladder is descended.

Each comparator returns "1" when the analog input signal is larger than the comparison voltage, and returns "0" when the analog input signal is less than the comparison voltage.

SUMMARY

The following description relates to a flash analog-to-digital converter (ADC) that reduces a capacitance of an input signal without any change in its size and power consumption, and a method thereof.

In one general aspect, there is provided a flash analog-to-digital converter (ADC) including: a first ADC unit that determines a most significant bit (MSB) of an analog input signal; a second ADC unit that includes a plurality of comparators that receive the analog input signal and a reference voltage and determine the remaining bits of the analog input signal; and a reference voltage control unit that varies the reference voltage input to the second ADC unit in accordance with the MSB determination result of the first ADC unit.

In another general aspect, there is provided a flash analog-to-digital conversion method, including: determining a MSB of an analog input signal; varying a reference voltage input to a plurality of comparators in accordance with the MSB determination result; and receiving the analog input signal and the varied reference voltage and determining remaining bits of the analog input signal using the plurality of comparators.

Other features and aspects will be apparent from the following detailed description, the drawings, and the claims.

Figure 1:
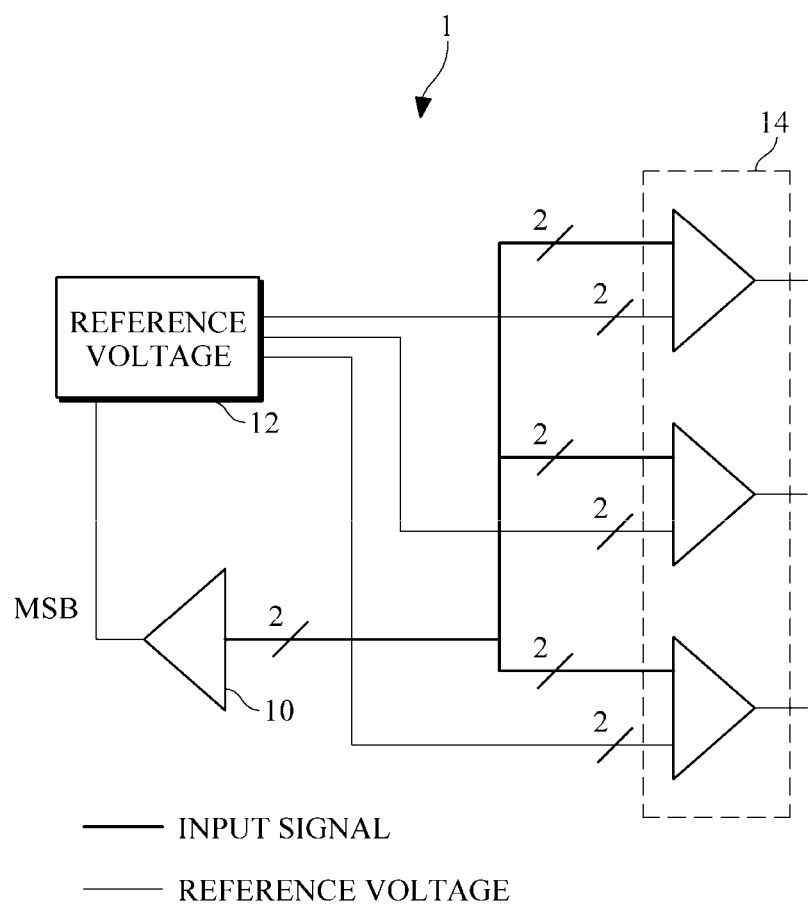
FIG. 1 is a configuration diagram illustrating a flash analog-to-digital converter (ADC) according to an embodiment of the present invention.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The following description is provided to assist the reader in gaining a comprehensive understanding of the methods, apparatuses, and/or systems described herein. Accordingly, various changes, modifications, and equivalents of the methods, apparatuses, and/or systems described herein will suggest themselves to those of ordinary skill in the art. Also, descriptions of well-known functions and constructions may be omitted for increased clarity and conciseness.

FIG. 1 is a configuration diagram illustrating a flash analog-to-digital converter 1 (ADC) according to an embodiment of the present invention.

Referring to FIG. 1, a flash analog-to-digital converter (hereinafter, referred to as "flash ADC") 1 includes a first ADC unit, a reference voltage control unit 12, and a second ADC unit 14.

The first ADC unit 10 receives an analog input signal and determines the most significant bit (hereinafter, referred to as "MSB") of the analog input signal.

The second ADC unit 14 includes a plurality of comparators that receive the analog input signal and a reference voltage and determine remaining bits of the analog input signal.

Each of the plurality of comparators of the second ADC unit 14 determines the remaining bits of the input signals by comparing the analog input signal and the reference voltage.

The plurality of comparators of the second ADC unit 14 include (+) and (−) terminals which receive the input signal, and (+) and (−) terminals which receive the reference voltage.

According to an embodiment, the first ADC unit 10 receives the analog input signal, and determines the MSB as "1" when the input analog input signal is larger than "0". In contrast, the first ADC unit 10 determines the MSB as "0" when the analog input signal is less than "0".

More specifically, all of the analog input signals and the reference voltages are input to the ADC in a differential signal form. In this instance, determining the MSB of the input signal means determining whether the input signal of the differential signal form is larger than "0".

The MSB of "0" means that all the input signals are less than "0", and the MSB of "1" means that all the input signals are larger than "0".

The reference voltage control unit 12 varies the reference voltage input to the second ADC unit 14 in accordance with the MSB determination result of the first ADC unit 10.

According to an embodiment, the reference voltage control unit 12 sets the reference voltages input to the plurality of comparators of the second ADC unit 14 as a positive value larger than "0" when the MSB is determined as "1" in accordance with the MSB determination result of the first ADC unit 10. In contrast, the reference voltage control unit 12 sets the reference voltages as a negative value less than "0" when the MSB is determined as "0". This will be described below in detail in FIGS. 3A and 3B.

According to an embodiment, the reference voltage control unit 12 changes the reference voltage to a positive value or a negative value by inputting the reference voltage to the plurality of comparators of the second ADC 14 in which positions of the (+) and (−) terminals are changed.

By changing the positions of the (+) and (−) terminals, the reference voltage having the positive value and the reference voltage having the negative value share a single comparator, thereby reducing an input capacitance. This will be described below in FIGS. 2A and 2B.

The plurality of comparators of the second ADC unit 14 amplify the input analog signal to thereby generate the amplified analog signal.

Next, a thermometer code detector receives the analog signal from the plurality of comparators of the second ADC 14 to thereby generate a digital signal having a thermometer code.

Next, an encoder directly converts the digital signal having the thermometer code into an n-bit digital signal. The thermometer code denotes an array in which a bit string in which a bit of the digital signal is "0" and a bit string in which a bit of the digital signal is "1" are arranged to face each other, such as 000 . . . 000111 . . . 111.

The flash ADC of the present invention may be applied to a coherent optical receiver which requires high-speed operation by reducing the input capacitance. In this case, an interpolation method which only the ADC has is used in the coherent optical receiver.

Figure 2A:
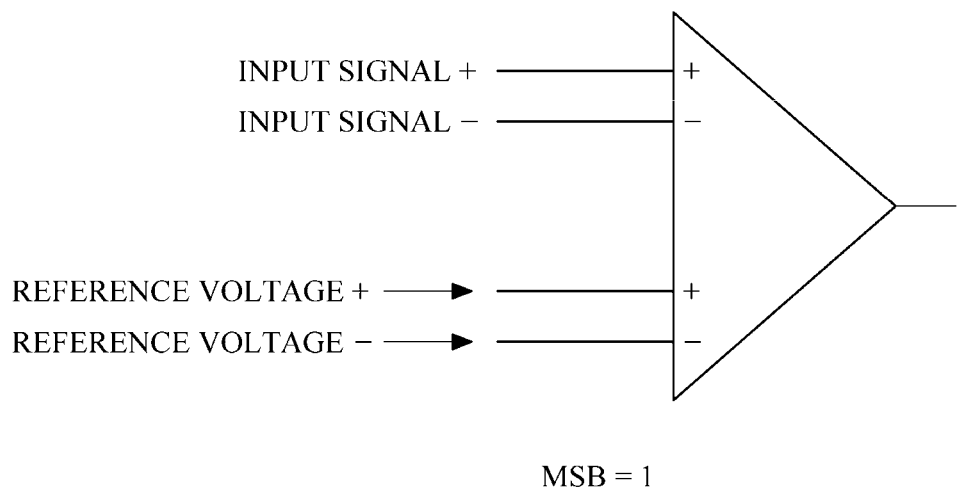
FIGS. 2A and 2B are diagrams for describing a process of changing a reference voltage according to an embodiment of the present invention.
Figure 2B:
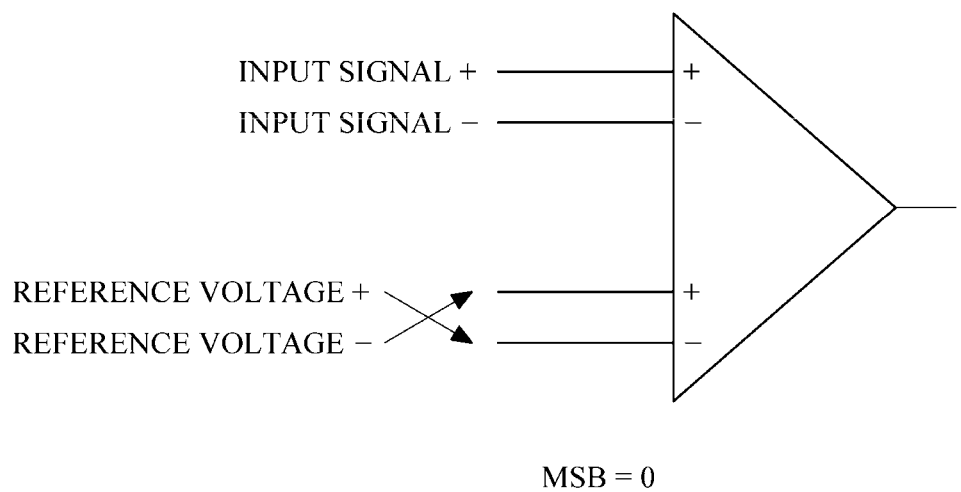

FIGS. 2A and 2B are diagrams for describing a process of changing a reference voltage according to an embodiment of the present invention.

Referring to FIGS. 2A and 2B, since the reference voltage is also the differential signal, the reference voltage may be changed to a positive value or a negative value by changing the positions of the (+) and (−) terminals when inputting the reference voltage to the comparator.

Consequently, by changing the positions of the (+) and (−) terminals, the reference voltages having the positive value and the negative value share a single comparator, so that the number of comparators is reduced to half, and a capacitance of the input signal is reduced to half.

However, since the flash ADC of the present invention is operated through the two steps of determining the MSB and determining the remaining bits, the flash ADC is required to have an interleaved structure in order to operate at the same speed as a general flash ADC. When the flash ADC has the interleaved structure, the number of comparators is again doubled, so that total power consumption and a size of the flash ADC of the present invention are almost the same in comparison with the general flash ADC which is operated through a single step.

Figure 3A:
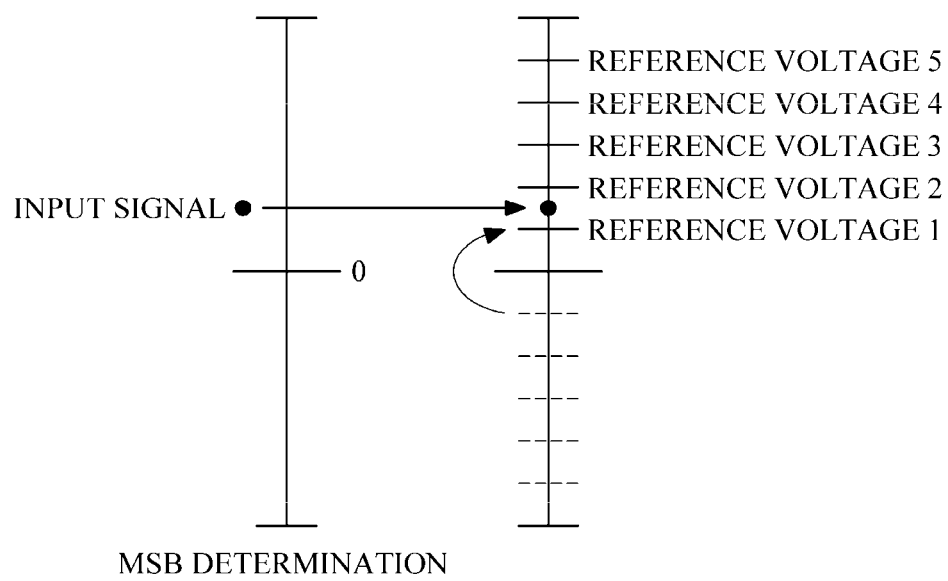
FIGS. 3A and 3B are diagrams for describing a process of varying a reference voltage input to a plurality of comparators in accordance with a result of determining the most significant bit (MSB) according to an embodiment of the present invention.
Figure 3B:
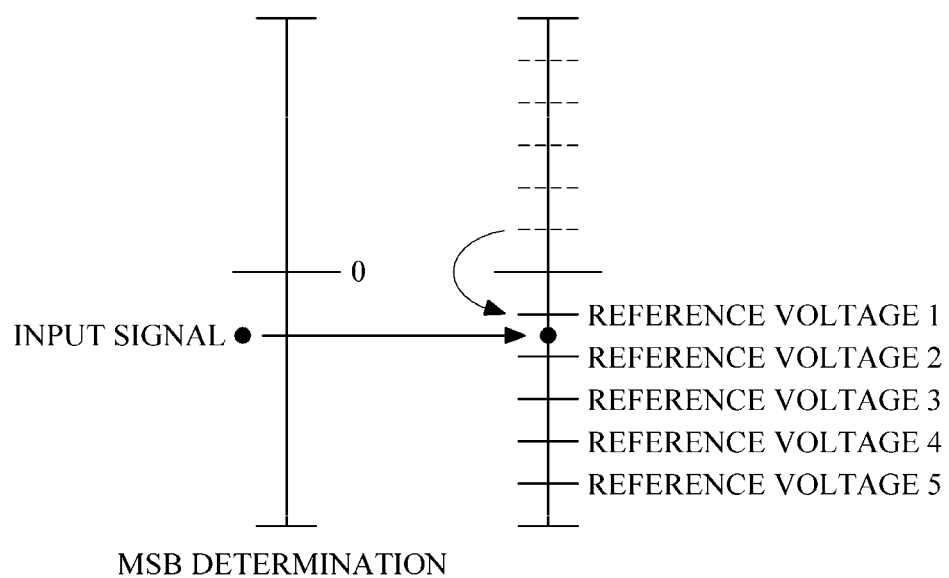

FIGS. 3A and 3B are diagrams for describing a process of varying a reference voltage input to a plurality of comparators in accordance with the MSB determination result according to an embodiment of the present invention.

Referring to FIGS. 1 and 3A, based on the MSB determination result of the reference voltage control unit 12, all the reference voltages to be compared with the input signal are set as positive values larger than "0" when the MSB is "1". For example, as shown in FIG. 3A, the input signal is larger than "0", so that all the reference voltages 1 to 5 are changed to positive values larger than "0".

In contrast, referring to FIGS. 1 and 3B, based on the MSB determination result of the reference voltage control unit 12, all the reference voltages are set as negative values less than "0" when the MSB is "0". For example, as shown in FIG. 3B, the input signal is less than "0", so that the reference voltages 1 to 5 are changed to negative values less than "0".

Figure 4:
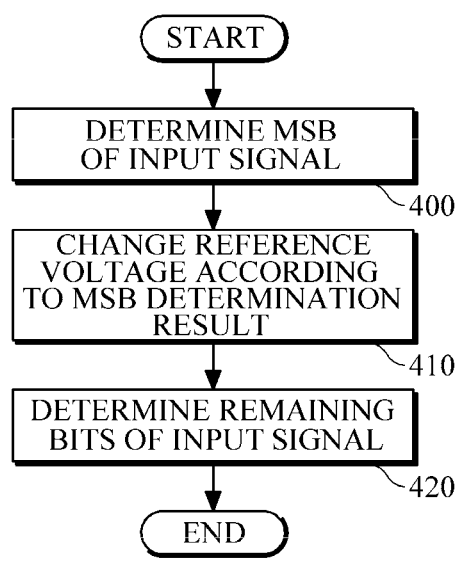
FIG. 4 is a flowchart illustrating a flash analog-to-digital conversion method according to an embodiment of the present invention.

FIG. 4 is a flowchart illustrating a flash analog-to-digital conversion method according to an embodiment of the present invention.

Referring to FIGS. 1 and 4, in step 400, the first ADC unit 10 determines the MSB of an analog input signal. In this instance, the first ADC unit 10 may determine the MSB as "1" when the input analog input signal is larger than "0", and determine the MSB as "0" when the input analog input signal is less than "0".

Next, in step 410, the reference voltage control unit 12 varies the reference voltage input to a plurality of comparators in accordance with the MSB determination result. In this instance, based on the determination result of the MSB, the reference voltage input to the plurality of comparators is set as a positive value larger than "0" when the MSB is determined as "1", and the reference voltage is set as a negative value less than "0" when the MSB is determined as "0".

By inputting the reference voltage to the plurality of comparators in which positions of (+) and (−) terminals are changed, the reference voltage may be changed to a positive value or a negative value.

By changing the positions of the (+) and (−) terminals, the reference voltage having the positive value and the reference voltage having the negative value share a single comparator, thereby reducing an input capacitance.

Next, in step 420, the second ADC 14 receives the analog input signal and the varied reference voltage to thereby determine the LSBs of the analog input signal using the plurality of comparators.

As apparent from the above description, according to the embodiments of the present invention, a flash ADC which may cut input capacitance in half compared to the general flash ADC is provided, thereby improving analog-to-digital conversion speed.

A number of examples have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A flash analog-to-digital converter (ADC), comprising:
a first ADC unit that determines a most significant bit (MSB) of an analog input signal;

a second ADC unit that includes a plurality of comparators that receive the analog input signal and a reference voltage and determine remaining bits of the analog input signal; and a reference voltage control unit that varies the reference voltage input to the second ADC unit in accordance with the MSB determination result of the first ADC unit.

2. The flash ADC according to claim 1, wherein the first ADC unit receives the analog input signal and determines the MSB as "1" when the input analog input signal is larger than "0" and as "0" when the input analog input signal is less than "0".

3. The flash ADC according to claim 1, wherein the reference voltage control unit sets the reference voltage input to the plurality of comparators of the second ADC unit as a positive value larger than "0" when the MSB is determined as "1" in accordance with the MSB determination result of the first ADC unit, and sets the reference voltage as a negative value less than "0" when the MSB is determined as "0".

4. The flash ADC according to claim 1, wherein the reference voltage control unit changes the reference voltage to a positive value or a negative value by inputting the reference voltage to the plurality of comparators of the second ADC unit in which positions of (+) and (−) terminals are changed.

5. The flash ADC according to claim 4, wherein the reference voltage control unit enables the reference voltage having a positive value and the reference voltage having a negative value to share a single comparator by changing the positions of (+) and (−) terminals, thereby reducing an input capacitance.

6. The flash ADC according to claim 1, wherein the second ADC unit includes a comparator having interpolation.

7. A flash analog-to-digital conversion method, comprising:

determining a MSB of an analog input signal;

varying a reference voltage input to a plurality of comparators in accordance with the MSB determination result; and receiving the analog input signal and the varied reference voltage and determining remaining bits of the analog input signal using the plurality of comparators.

8. The flash analog-to-digital conversion method according to claim 7, wherein in determining the MSB, the MSB is determined as "1" when the input analog input signal is larger than "0" and is determined as "0" when the analog input signal is less than "0".

9. The flash analog-to-digital conversion method according to claim 7, wherein in varying the reference voltage, the reference voltage input to the plurality of comparators is set as a positive value larger than "0" when the MSB is determined as "1" and set as a negative value less than "0" when the MSB is determined as "0".

10. The flash analog-to-digital conversion method according to claim 7, wherein in varying the reference voltage, the reference voltage is changed to a positive value or a negative value by inputting the reference voltage to the plurality of comparators in which positions of (+) and (−) terminals are changed.

* * * * *